US010972079B2

(12) United States Patent
Chen

(10) Patent No.: US 10,972,079 B2
(45) Date of Patent: Apr. 6, 2021

(54) COMMON MODE VOLTAGE LEVEL SHIFTING AND LOCKING CIRCUIT

(71) Applicant: IC Plus Corp., Hsin-Chu (TW)

(72) Inventor: Wen-Wei Chen, Hsin-Chu (TW)

(73) Assignee: IC Plus Corp., Hsin-Chu (TW)

( * ) Notice: Subject to any disclaimer, the term of this patent is extended or adjusted under 35 U.S.C. 154(b) by 0 days.

(21) Appl. No.: 16/719,998

(22) Filed: Dec. 19, 2019

(65) Prior Publication Data

US 2020/0350897 A1 Nov. 5, 2020

(30) Foreign Application Priority Data

May 2, 2019 (TW) ................................. 108115302

(51) Int. Cl.
*H03L 5/00* (2006.01)
*H03K 3/0233* (2006.01)
(52) U.S. Cl.
CPC ................................. *H03K 3/0233* (2013.01)
(58) Field of Classification Search
CPC ..... H03K 19/018521; H03K 3/356113; H03K 19/00315; H03K 17/102; H03K 3/012
See application file for complete search history.

(56) References Cited

U.S. PATENT DOCUMENTS

| 7,049,848 B2 | 5/2006 | Brooks et al. |
| 7,466,193 B2 | 12/2008 | Kim |
| 7,570,108 B2 * | 8/2009 | Morgan .................... G05F 1/56 327/513 |
| 7,821,333 B2 | 10/2010 | Yan et al. |
| 2009/0058527 A1 * | 3/2009 | Srinivasa ............ H03F 3/45183 330/259 |
| 2014/0145789 A1 * | 5/2014 | Sugimoto ............... H03F 3/087 330/252 |
| 2015/0061767 A1 * | 3/2015 | Francis ............... H03F 3/45188 330/258 |
| 2018/0287576 A1 * | 10/2018 | Sugiura ............... H03F 3/45748 |

FOREIGN PATENT DOCUMENTS

| TW | 200913481 | 3/2009 |
| TW | 201145813 | 12/2011 |

OTHER PUBLICATIONS

"Office Action of Taiwan Counterpart Application", dated Dec. 17, 2019, p. 1-p. 3.

\* cited by examiner

*Primary Examiner* — Quan Tra
(74) *Attorney, Agent, or Firm* — JCIPRNET

(57) ABSTRACT

A common mode voltage level shifting and locking circuit is provided. The common mode voltage level shifting and locking circuit includes an operational amplifier, a source follower, a first feedback circuit, and a second feedback circuit. The operational amplifier generates a first common mode voltage. The source follower shifts the first common mode voltage to generate a second common mode voltage. The first feedback circuit generates a first control signal according to the second common mode voltage. The operational amplifier adjusts the first common mode voltage according to the first control signal. The second feedback circuit generates a second control signal according to an external reference voltage provided by a next stage circuit. The source follower adjusts the second common mode voltage according to the second control signal such that the next stage circuit reaches a maximum input common mode range.

9 Claims, 2 Drawing Sheets

COMMON MODE VOLTAGE LEVEL SHIFTING AND LOCKING CIRCUIT

CROSS-REFERENCE TO RELATED APPLICATION

This application claims the priority benefit of Taiwan application serial no. 108115302, filed on May 2, 2019. The entirety of the above-mentioned patent application is hereby incorporated by reference herein and made a part of this specification.

BACKGROUND OF THE INVENTION

1. Field of the Invention

The invention relates to an output interface circuit, and more particularly, to a common mode voltage level shifting and locking circuit for differential signal output.

2. Description of Related Art

In general, in a receiving system used in an Ethernet network, a voltage of a supplied power at a receiver end is mainly 3.3V or 1.8V. If power consumption needs to be further reduced, it can be considered to reduce the supplied power. For instance, the voltage of the supplied power of one specific stage circuit may be reduced from 3.3V to 1V at the receiver end. However, in the above manner, a voltage level of a common mode voltage of an output signal of a previous stage circuit needs to be strictly specified. If the voltage of the supplied power is reduced to 1V, within a power range of 1V, the voltage level of the common mode voltage needs to approach 0.5V. Once a previous stage common mode voltage level deviates from an input common mode range acceptable by a next stage circuit due to process-voltage-temperature (PVT) variations, an output signal of the next stage circuit will be clapped to cause distortion.

SUMMARY OF THE INVENTION

The invention provides an output interface circuit for shifting and locking a differential signal output common mode voltage.

A common mode voltage level shifting and locking circuit of the invention includes an operational amplifier, a source follower, a first feedback circuit, and a second feedback circuit. The operational amplifier is configured to generate a first common mode voltage affected by a feedback. The source follower is coupled to the operational amplifier. The source follower is configured to shift a voltage level of the first common mode voltage to generate a second common mode voltage. The first feedback circuit is coupled to the source follower. The first feedback circuit is configured to generate a first control signal according to a voltage level of the second common mode voltage. The operational amplifier adjusts the voltage level of the first common mode voltage according to the first control signal. The second feedback circuit is coupled to the source follower. The second feedback circuit is configured to generate a second control signal according to an external reference voltage provided by a next stage circuit. The source follower also adjusts the voltage level of the second common mode voltage according to the second control signal such that the next stage circuit reaches a maximum input common mode range.

Based on the above, the common mode voltage level shifting and locking circuit of the invention can shift the voltage level of the first common mode voltage through the source follower to generate the second common mode voltage, and can generate the second control signal through the second feedback circuit according to the reference voltage provided by the next stage circuit. The common mode voltage level shifting and locking circuit can adjust the voltage level of the second common mode voltage according to the second control signal to match a next stage common mode level of the next stage circuit so the next stage circuit can reach the maximum input common mode range. As a result, the common mode voltage level shifting and locking circuit can output the second common mode voltage with a stable voltage level, and the second common mode voltage can match the next stage common mode level of the next stage circuit so the next stage circuit can reach the maximum input common mode range.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
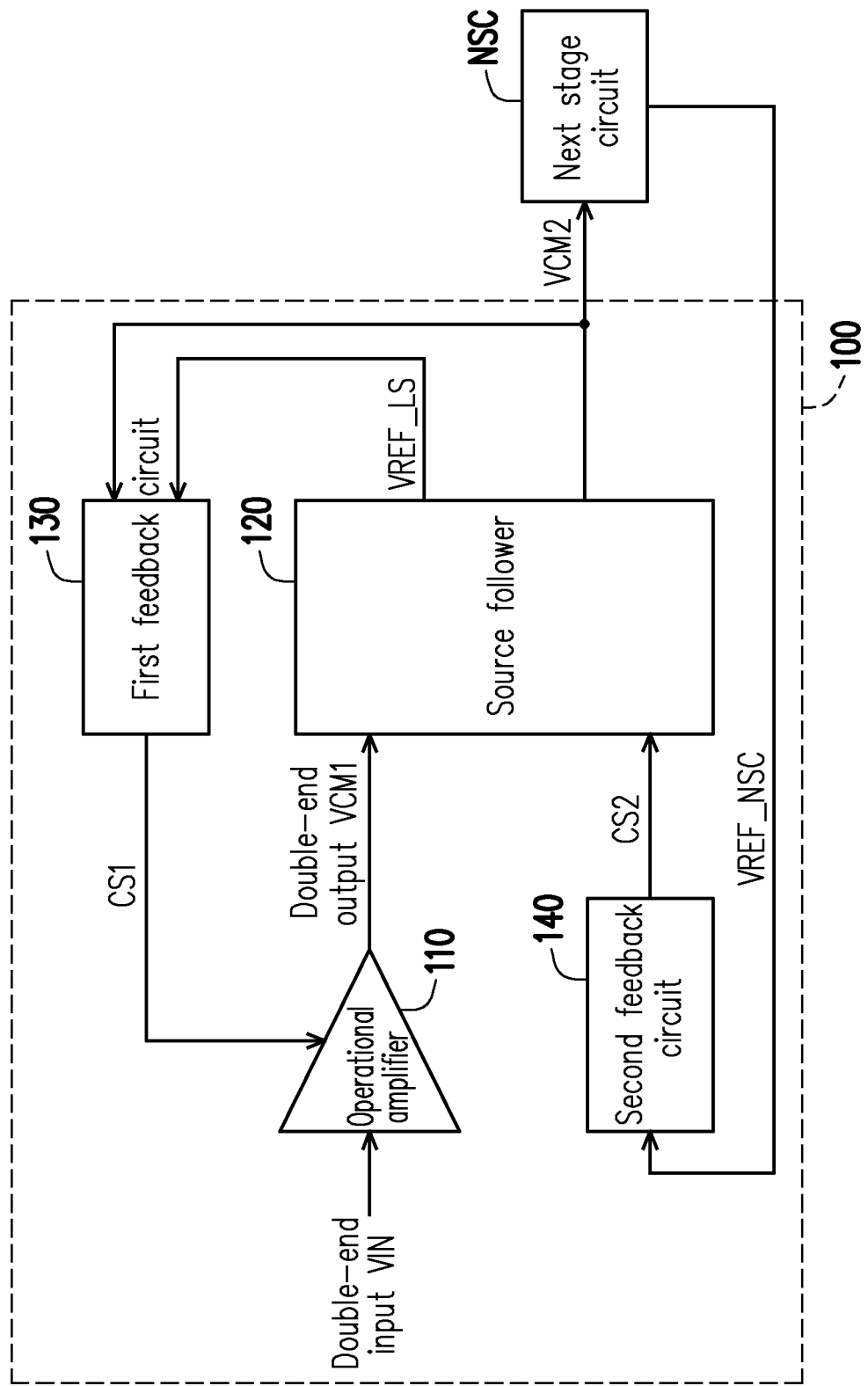
FIG. 1 is a schematic diagram illustrating a common mode voltage level shifting and locking circuit according to a first embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

With reference to FIG. 1, FIG. 1 is a schematic diagram illustrating a common mode voltage level shifting and locking circuit according to a first embodiment of the invention. In this embodiment, a common mode voltage level shifting and locking circuit 100 can output a stable common mode voltage. The common mode voltage level shifting and locking circuit 100 includes an operational amplifier 110, a source follower 120, a first feedback circuit 130, and a second feedback circuit 140. The operational amplifier 110 is configured to generate a first common mode voltage VCM1 according a feedback result of the first feedback circuit 130. In other words, the first common mode voltage VCM1 can be adjusted according to the feedback result. The operational amplifier 110 receives a double-end input signal VIN, and generates a differential output (this output is carried on the first common mode voltage VNM1) according to the double-end input signal VIN. In this embodiment, the source follower 120 is coupled to the operational amplifier 110. The operational amplifier 110 may be implemented by, for example, a differential operational amplifier. The source follower 120 receives the first common mode voltage VCM1, and shifts a voltage level of the first common mode voltage VCM1 to generate a second common mode voltage VCM2. The first common mode voltage VCM1 and the second common mode voltage VCM2 both carry a differential signal. In addition, the source follower 120 can obtain a reference voltage through a bandgap circuit (not shown), and shift the reference voltage through the source follower to provide a shifted reference voltage VREF_LS. The shifted reference voltage VREF_LS is configured to serve as a reference for the first feedback circuit 130.

In this embodiment, the first feedback circuit 130 is coupled to the source follower 120. The first feedback circuit 130 generates a first control signal CS1 according to a voltage level of the second common mode voltage VCM2, and provides the first control signal CS1 to the operational amplifier 110. Further, the first feedback circuit 130 receives the second common mode voltage VCM2 provided by the source follower 120 to be compared with the shifted reference voltage VREF_LS to generate the first control signal CS1. Accordingly, the operational amplifier 110 can lock the voltage level of the first common mode voltage VCM1 according to the first control signal CS1. In this embodiment, the second feedback circuit 140 receives an external reference voltage VREF_NSC provided by a next stage circuit NSC. The second feedback circuit 140 generates a second control signal CS2 according to the external reference voltage VREF_NSC. The second feedback circuit 140 provides the second control signal C2 to the source follower 120.

Here, it is worth noting that, the common mode voltage level shifting and locking circuit 100 compares the second common mode voltage VCM2 with the shifted reference voltage VREF_LS supplied by the source follower 120, and generating the first control signal CS1 through the first feedback circuit 130, so as to obtain the first common mode voltage VCM1. In addition, the common mode voltage level shifting and locking circuit 100 generates the second control signal CS2 through the second feedback circuit 140 according to the external reference voltage VREF_NSC provided by the next stage circuit. In this way, the common mode voltage level shifting and locking circuit 100 can have the first common mode voltage VCM1 with a stable voltage level, and can output the second common mode voltage VCM2 with a stable voltage level according to the first common mode voltage VCM1. Also, the second common mode voltage VCM2 can match a next stage common mode level of the next stage circuit NSC so the next stage circuit NSC can reach a maximum input common mode range.

For instance, the common mode voltage level shifting and locking circuit 100 may be an interface circuit in an application for reducing a voltage value of the supplied voltage form 3.3V to 1V. Based on aforesaid application, the operational amplifier 110 can generate the first common mode voltage VCM1 with the voltage level of 1.65V. The source follower 120 receives the first common mode voltage VCM1, and shifts the voltage level of the first common mode voltage VCM1 according to the first control signal CS1 to generate the second common mode voltage VCM2 with the voltage level of 0.5V. In other words, the voltage level of the second common mode voltage VCM2 is less than the voltage level of the first common mode voltage VCM1.

The source follower 120 can shift the voltage level of the first common mode voltage VCM1 generated according to the first control signal CS1 to generate the second common mode voltage VCM2. In addition, the source follower 120 can receive a stable voltage level (e.g., the reference voltage), and shift the stable voltage level to generate the shifted reference voltage with the voltage level stabilized at 0.5V. In this embodiment, the bandgap circuit (not shown) is configured to provide the stable voltage level with a reference potential of 1.65V, and the source follower 120 is configured to shift the reference potential to generate the shifted reference voltage VREF_LS (0.5V).

According to the above example, the first feedback circuit 130 receives the second common mode voltage VCM2. The first feedback circuit 130 generates the first control signal CS1 according to a comparison result of the voltage level of the second common mode voltage VCM2 and a voltage level of the shifted reference voltage VREF_LS (0.5V). If the first feedback circuit 130 determines that the voltage level of the second common mode voltage VCM2 is greater than the voltage level of the shifted reference voltage VREF_LS (i.e., the voltage level of the second common mode voltage VCM2 deviates), the first feedback circuit 130 can use the first control signal CS1 to reduce the voltage level of the first common mode signal VCM1 through the operational amplifier 110, so as to instruct the source follower 120 to reduce the voltage level of the second common mode signal VCM2. If the first feedback circuit 130 determines that the voltage level of the second common mode voltage VCM2 is less than the voltage level of the shifted reference voltage VREF_LS (i.e., the voltage level of the second common mode voltage VCM2 deviates), the first feedback circuit 130 can use the first control signal CS1 to increase the voltage level of the first common mode signal through the operational amplifier 110, so as to instruct the source follower 120 to increase the voltage level of the second common mode signal VCM2. If the first feedback circuit 130 determines that the voltage level of the second common mode voltage VCM2 is equal to the voltage level of the shifted reference voltage VREF_LS, the first feedback circuit 130 does not change the first control signal CS1. Accordingly, with cooperation of the source follower 120 and the first feedback circuit 130, the first control signal CS1 can be used to ensure that the voltage level of the second common mode voltage VCM2 can accurately follow the voltage level (e.g., 0.5V) as expected and can be locked thereto. Therefore, the second common mode voltage VCM2 will not deviate due to the PVT variations.

The second feedback circuit 140 receives the external reference voltage VREF_NSC provided by the next stage circuit NSC to generate the second control signal CS2. The source follower 120 adjusts the voltage level of the second common mode voltage VCM2 according to the second control signal CS2. In this way, the second common mode voltage VCM2 may be further fine-tuned to match the next stage common mode level of the next stage circuit NSC such that the next stage circuit NSC reaches the maximum input common mode range.

Figure 2:
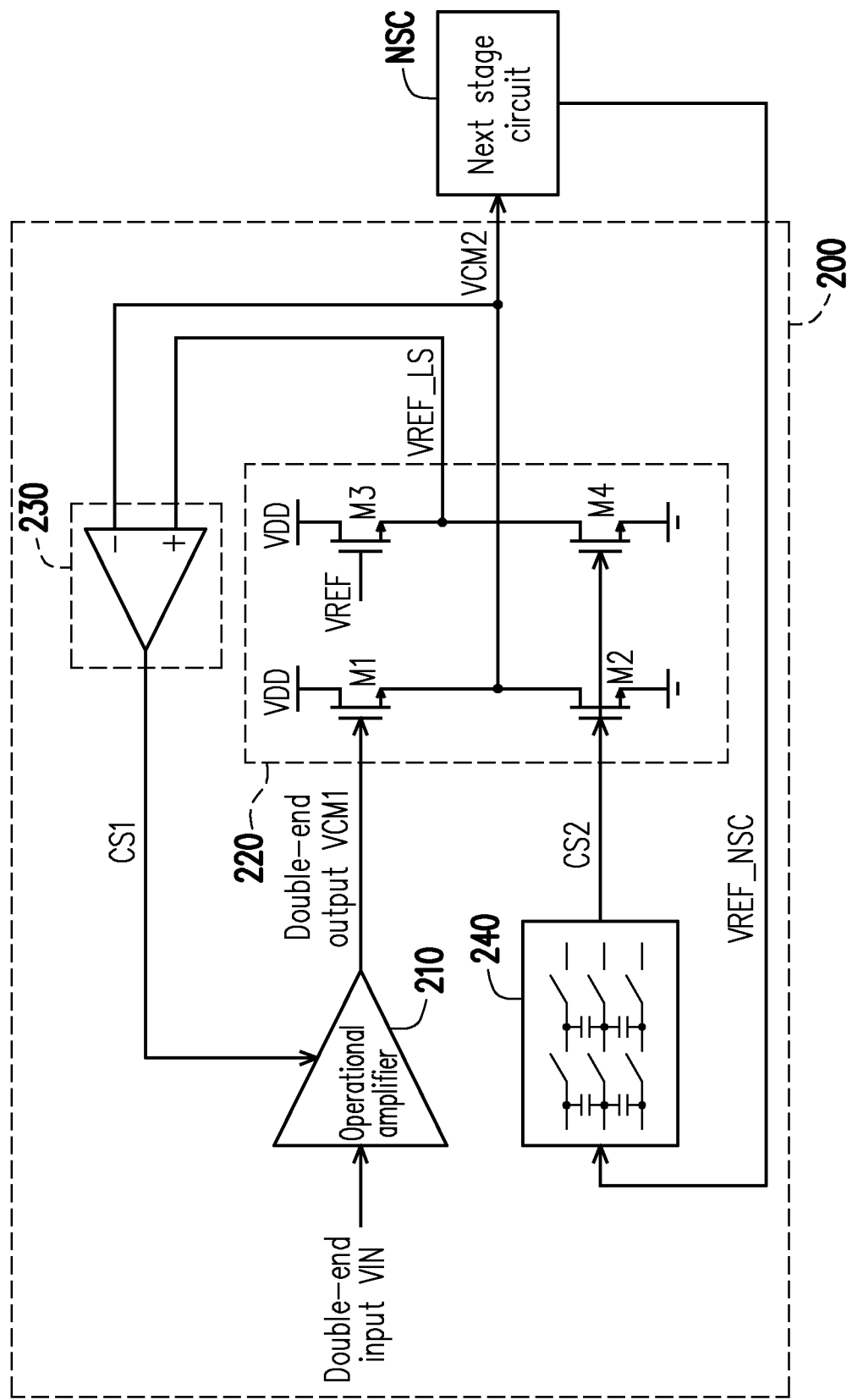
FIG. 2 is a schematic diagram illustrating a common mode voltage level shifting and locking circuit according to a second embodiment of the invention.

With reference to FIG. 2, FIG. 2 is a schematic diagram illustrating a common mode voltage level shifting and locking circuit according to a second embodiment of the invention. A common mode voltage level shifting and locking circuit 200 includes an operational amplifier 210, a source follower 220, a first feedback circuit 230, and a second feedback circuit 240. Coupling manner and cooperation between the operational amplifier 210, the source follower 220, the first feedback circuit 230, and the second feedback circuit 240 can be adequately taught by the description for the first embodiment of FIG. 1, which is not repeated hereinafter. In this embodiment, the source follower 220 includes a first transistor M1, a second transistor M2, a third transistor M3 and a fourth transistor M4. A first terminal of the first transistor M1 is configured to receive a voltage source VDD. A second terminal of the first transistor M1 serves as an output circuit of the common mode voltage level shifting and locking circuit 200. A control terminal of the first transistor M1 is coupled to the operational amplifier 210 to receive the first common mode voltage VCM1. A first terminal of the second transistor M2 is coupled to the second terminal of the first transistor M1. A second terminal of the second transistor M2 is configured to receive a reference low voltage (e.g., to be grounded). A control terminal of the second transistor M2 is coupled to the second feedback circuit 240 to receive the second control signal CS2. A first terminal of the third transistor M3 is configured to receive the voltage source VDD. A second terminal of the third transistor M3 is configured to provide the shifted reference voltage VREF_LS. A control terminal of the third transistor M3 is configured to receive a reference voltage VREF. A first terminal of the fourth transistor M4 is coupled to the second terminal of the third transistor M3, A second terminal of the fourth transistor M4 is configured to receive the reference low voltage. A control terminal of the fourth transistor M4 is coupled to the second feedback circuit 240 to receive the second control signal CS2. For illustrative convenience, FIG. 2 only shows the first transistor M1, the second transistor M2, the third transistor M3 and the fourth transistor M4 in the source follower 220. It should be understood that, under the premise that the first common mode voltage VCM1 and the second common mode voltage VCM2 carry a differential signal pair, the source follower 220 further includes a fifth transistor and a sixth transistor (not shown). The control terminal of the first transistor M1 receives a first signal of the differential signal pair carried by the first common mode voltage VCM1. The second terminal of the first transistor M1 is configured to provide the first signal of the differential signal pair carried by the second common mode voltage VCM2. A first terminal of the fifth transistor is configured to receive the voltage source VDD. A control terminal of the fifth transistor is configured to receive a second signal of the differential signal pair carried by the first common mode voltage VCM1. A second terminal of the fifth transistor is configured to provide the second signal of the differential signal pair carried by the second common mode voltage VCM2. A first terminal of the sixth transistor is coupled to the second terminal of the fifth transistor. A second terminal of the sixth transistor is configured to receive the reference low voltage. A control terminal of the sixth transistor is coupled to the second feedback circuit 240 to receive the second control signal CS2.

In this embodiment, the source follower 220 is also a buffer with a drive capability. Accordingly, other than providing the second common mode voltage VCM2 and the differential signal pair to the first feedback circuit 230 in the common mode voltage level shifting and locking circuit 200, the source follower 220 also includes a driving current enough for outputting the second common mode voltage VCM2 and the differential signal pair to the next stage circuit NSC.

For instance, the common mode voltage level shifting and locking circuit 200 may be an output interface circuit in an application for reducing the voltage value of the supplied voltage form 3.3V to 1V. Based on aforesaid application, the operational amplifier 210 can generate the first common mode voltage VCM1 with the voltage level of 1.65V. The source follower 220 receives the first common mode voltage VCM1, and shifts the voltage level of the first common mode voltage VCM1 to generate the second common mode voltage VCM2 with the voltage level of 0.5V as expected. In this embodiment, the first feedback circuit 230 is implemented by a continuous time common mode feedback (CT-CMFB) circuit. In this way, the first feedback circuit 230 can constantly conduct the comparison through the continuous time common mode feedback circuit according to a difference between the voltage level of the second common mode voltage VCM2 and the voltage level of the shifted reference voltage VREF_LS, and provide the result of the difference between the voltage level of the second common mode voltage VCM2 and the voltage level of the shifted reference voltage VREF_LS to the operational amplifier 210. The first feedback circuit 230 may include an operational amplifier or may be implemented by an operational amplifier. The first feedback circuit 230 has a first input and a second input. The first input of the first feedback circuit 230 is configured to receive the second common mode voltage VCM2. The second input of the first feedback circuit 230 is configured to receive the shifted reference voltage VREF_LS. The first input of the first feedback circuit 230 may be an inverted input terminal. The second input of the first feedback circuit 230 may be a non-inverted input terminal. The first feedback circuit 230 compares the voltage level of the second common mode voltage VCM2 and the voltage level of the shifted reference voltage VREF_LS to obtain a comparison result. When the comparison result indicates that the voltage level of the second common mode voltage VCM2 is greater than the voltage level of the shifted reference voltage VREF_LS (i.e., the difference is less than 0), the first feedback circuit 230 can provide the corresponding first control signal CS1 according to the difference, so as to instruct the operational amplifier 210 to reduce the voltage level of the first common mode voltage VCM1. When the comparison result indicates that the voltage level of the second common mode voltage VCM2 is less than the voltage level of the shifted reference voltage VREF_LS (i.e., the difference is greater than 0), the first feedback circuit 230 can provide the corresponding first control signal CS1 according to the difference, so as to instruct the operational amplifier 210 to increase the voltage level of the first common mode voltage VCM1. If the first feedback circuit 230 determines that the voltage level of the second common mode voltage VCM2 is equal to the voltage level of the shifted reference voltage VREF_LS (i.e., the difference is equal to 0), the first feedback circuit 230 does not change the first control signal CS1.

In addition, in design of the first feedback circuit 230, the first input of and the second input are implemented by connecting to a gate of a P-type metal-oxide semiconductor field-effect (MOSFET) transistor, respectively. Such a design is suitable for the first feedback circuit 230 to conduct the comparison in a voltage condition of low voltage (approximately 0.5V) since the P-type metal-oxide semiconductor field-effect (MOSFET) transistor can prevent the transistors corresponding to the first input and the second input in the first feedback circuit 230 from an incomplete conduction caused by a low voltage input.

In this embodiment, the second feedback circuit 240 is implemented by a switched-capacitor common mode feedback (SC-CMFB) circuit. The second feedback circuit 240 receives the external reference voltage VREF_NSC provided by the next stage circuit NSC, and is controlled by a set of clocks with non-overlap phases to generate the second control signal CS2. Said clocks may be provided by, for example, a non-overlap clock generator. For instance, the next stage circuit NSC can reach the maximum input common mode range when a common mode voltage level is 0.51V. The next stage circuit NSC provides the external reference voltage VREF_NSC with the voltage level of 0.51V. The second feedback circuit 240 generates the corresponding second control signal CS2 according to the external reference voltage VREF_NSC of 0.51V. Accordingly, the source follower 220 can adjust the voltage level of the second common mode voltage VCM2 to 0.51V according to the second control signal CS2. Similarly, the voltage level of the shifted reference voltage VREF_LS is also adjusted to 0.51V.

In summary, the common mode voltage level shifting and locking circuit of the invention can shift the voltage level of the first common mode voltage level through the source follower and can generate the second control signal through the second feedback circuit according to the external reference voltage provided by the next stage circuit. Therefore, the voltage level of the first common mode voltage and the voltage level of the second common mode voltage will not deviate due to the PVT variations. As a result, the common mode voltage level shifting and locking circuit can output the second common mode voltage with a stable voltage level, and the second common mode voltage can match the next stage common mode level of the next stage circuit so the next stage circuit can reach the maximum input common mode range.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A common mode voltage level shifting and locking circuit, comprising:
    an operational amplifier, configured to generate a first common mode voltage affected by a feedback;
    a source follower, coupled to the operational amplifier, and configured to shift a voltage level of the first common mode voltage to generate a second common mode voltage;
    a first feedback circuit, coupled to the source follower, and configured to generate a first control signal according to a voltage level of the second common mode voltage, wherein the operational amplifier adjusts the voltage level of the first common mode voltage according to the first control signal; and
    a second feedback circuit, coupled to the source follower, and configured to generate a second control signal according to an external reference voltage provided by a next stage circuit,
    wherein the source follower adjusts the voltage level of the second common mode voltage according to the second control signal such that the next stage circuit reaches a maximum input common mode range.

2. The common mode voltage level shifting and locking circuit of claim 1, wherein the first feedback circuit is implemented by a continuous time common mode feedback circuit, wherein the first feedback circuit adjusts the first control signal according to a variation of the second common mode voltage.

3. The common mode voltage level shifting and locking circuit of claim 2, wherein the source follower comprises:
    a first transistor, a first terminal of the first transistor being configured to receive a voltage source, a second terminal of the first transistor serving as an output terminal of the common mode voltage level shifting and locking circuit, a control terminal of the first transistor being coupled to the operational amplifier to receive the first common mode voltage;
    a second transistor, a first terminal of the second transistor being coupled to the second terminal of the first transistor, a second terminal of the second transistor being configured to receive a reference low voltage, a control terminal of the second transistor being coupled to the second feedback circuit to receive the second control signal;
    a third transistor, a first terminal of the third transistor being configured to receive the voltage source, a second terminal of the third transistor being configured to provide a shifted reference voltage, a control terminal of the third transistor being configured to receive a reference voltage; and
    a fourth transistor, a first terminal of the fourth transistor being coupled to the second terminal of the third transistor, a second terminal of the fourth transistor being configured to receive the reference low voltage, a control terminal of the fourth transistor being coupled to the second feedback circuit to receive the second control signal.

4. The common mode voltage level shifting and locking circuit of claim 3, wherein the source follower is further configured to receive the reference voltage and shift a voltage level of the reference voltage according to the second control signal to generate the shifted reference voltage.

5. The common mode voltage level shifting and locking circuit of claim 3, wherein the source follower is further configured to:
    obtain the reference voltage through a bandgap circuit.

6. The common mode voltage level shifting and locking circuit of claim 1, wherein the second feedback circuit is implemented by a switched-capacitor common mode feedback circuit.

7. The common mode voltage level shifting and locking circuit of claim 3, wherein a first input of the first feedback circuit is coupled to the second terminal of the first transistor to receive the second common mode voltage, the second input of the first feedback circuit is coupled to the second terminal of the third transistor to receive a shifted reference voltage.

8. The common mode voltage level shifting and locking circuit of claim 1, wherein a first input of the first feedback circuit and a second input of the first feedback circuit are implemented by connecting to a gate of a P-type metal-oxide semiconductor field-effect transistor, respectively.

9. The common mode voltage level shifting and locking circuit of claim 1, wherein the voltage level of the second common mode voltage is less than the voltage level of the first common mode voltage.

* * * * *